US010948627B2

(12) United States Patent
Swillam et al.

(10) Patent No.: US 10,948,627 B2
(45) Date of Patent: Mar. 16, 2021

(54) INFRARED SUBWAVELENGTH FOCUSING IN SILICON AND ENERGY HARVESTING DEVICES

(71) Applicant: The American University in Cairo, New York, NY (US)

(72) Inventors: Mohamed Swillam, New Cairo (EG); Manar A. Abdel-Galil, Nasr (EG); Yehea Ismail, New Cairo (EG)

(73) Assignee: The American University in Cairo, New York, NY (US)

( * ) Notice: Subject to any disclaimer, the term of this patent is extended or adjusted under 35 U.S.C. 154(b) by 0 days.

(21) Appl. No.: 16/368,117

(22) Filed: Mar. 28, 2019

(65) Prior Publication Data

US 2019/0302312 A1 Oct. 3, 2019

Related U.S. Application Data

(60) Provisional application No. 62/650,627, filed on Mar. 30, 2018, provisional application No. 62/816,088, filed on Mar. 9, 2019.

(51) Int. Cl.
*H01L 35/30* (2006.01)
*G02B 1/00* (2006.01)
*H01L 35/32* (2006.01)

(52) U.S. Cl.
CPC .............. *G02B 1/002* (2013.01); *H01L 35/30* (2013.01); *H01L 35/32* (2013.01)

(58) Field of Classification Search
CPC ................................................... G02B 1/002
See application file for complete search history.

(56) References Cited

PUBLICATIONS

Gao et al., "Metallic Planar Lens With Binary Nanoscale Slits," IEEE Photonics Technology Letters, vol. 24, No. 11, June 1, 2012 (Year: 2012).*
Soref, "Mid-infrared photonics in silicon and germanium," Nature Photonics | vol. 4 | Aug. 2010, p. 495 (Year: 2010).*
Shi et al, "Beam manipulating by metallic nano-slits with variant widths," Sep. 5, 2005 / vol. 13, No. 18 / Optics Express 6815 (Year: 2005).*
Abdel-Galil ("Subwavelength focusing in the infrared range using a meta surface," publicly presented Mar. 27, 2017 in Florence, Italy, more than one year from the earliest filing date of a priority application (Year: 2017).*
Abdel-Galil et al. "Subwavelength focusing in the infrared range using a planar metallic lens of binary slits with refractive index modulation", Proc. SPIE 10535, Integrated Optics: Devices, Materials, and Technologies XXII, 105351W (Mar. 9, 2018).

(Continued)

*Primary Examiner* — Angelo Trivisonno
(74) *Attorney, Agent, or Firm* — Lumen Patent Firm

(57) ABSTRACT

An infrared subwavelength metasurface lens implements slit width modulation focusing of infrared light into a subwavelength region located within a silicon substrate. The lens includes a metasurface deposited on a surface of the silicon substrate, where the metasurface has multiple discrete copper elements separated by uniformly distributed slits of different widths. The device may also implement refractive index modulation by filling different slits with silicon or air. The infrared subwavelength metasurface lens may be coupled with a thermoelectric generator to form a thermoelectric infrared harvesting device.

5 Claims, 9 Drawing Sheets

(56) References Cited

PUBLICATIONS

Abdel-Galil et al., "Subwavelength focusing in the infrared range using a planar metallic lens of binary slits with refractive index modulation," Photonics West Poster Session, Jan. 31, 2018.

Jia et al., A Subwavelength Focusing Structure Composite of Nanoscale Metallic Slits Array With Patterned Dielectric Substrate, IEEE Photonics Journal 6(1):1-8 • Feb. 2014 with 112 Reads DOI: 10.1109/JPHOT.2014.2298406.

Abdel-Galil et al., Subwavelength focusing in the infrared range using a meta surface, Mar. 26-30, 2017, 2017 International Applied Computational Electromagnetics Society Symposium—Italy (ACES).

Stanley R., "Plasmonics in the mid-infrared," Nature Photonics 6, 409-411 (2012).

Byrnes SJ, Blanchard R and Capasso F, "Harvesting renewable energy from Earth's mid-infrared emissions," PNAS 111(11), 3927-32(2014).

Shi H, Wang C, Du C, Luo X, Dong X, Gao H., "Beam manipulating by metallic nano-slits with variant widths," Optics express 13(18), 6815-20 (2005).

Chen Q., "A novel plasmonic zone plate lens based on nano-slits with refractive index modulation," Springer US 6(2), 381-5(2011).

Verslegers L, Catrysse PB, Yu Z, White JS, Barnard ES, Brongersma ML, Fan S., "Planar lenses based on nanoscale slit arrays in a metallic film.," Nano letters 9(1), 235-8(2008).

Gao Y, Liu J, Zhang X, Wang Y, Song Y, Liu S., "Metallic planar lens with binary nanoscale slits.," IEEE Photonics Technology Letters 24(11), 969-71(2012).

El Maklizi M, Hendawy M, Swillam MA, "Super-focusing of visible and UV light using a Meta surface," Journal of Optics 16(10), 105007(2014).

Law S., Podolskiy V., Wasserman D., "Towards nano-scale photonics with micro-scale photons: the opportunities and challenges of mid-infrared plasmonics.," Nanophotonics 2(2),103-30 (2013).

Soref R., "Mid-infrared photonics in silicon and germanium," Nature Photonics 4, 495-497 (2010).

Stanley R., "Plasmonics in the mid-infrared," Nature Photonics 6(7), 409-11(2012).

\* cited by examiner

Fig. 13
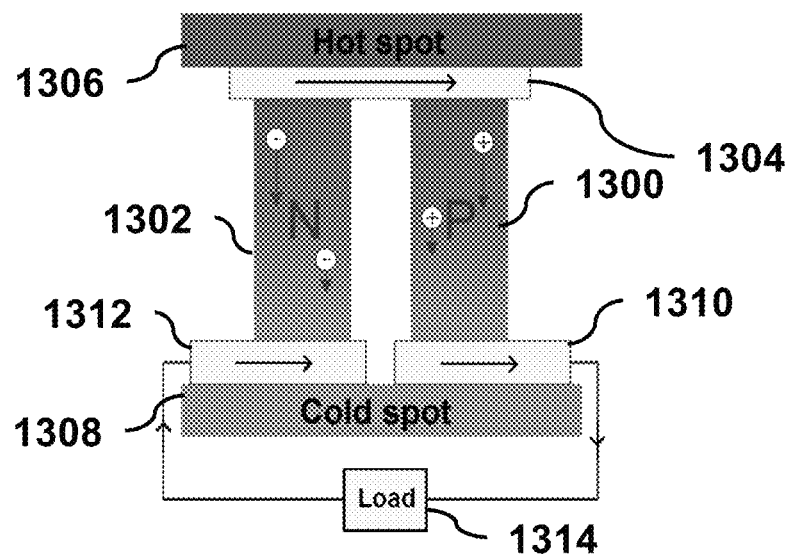
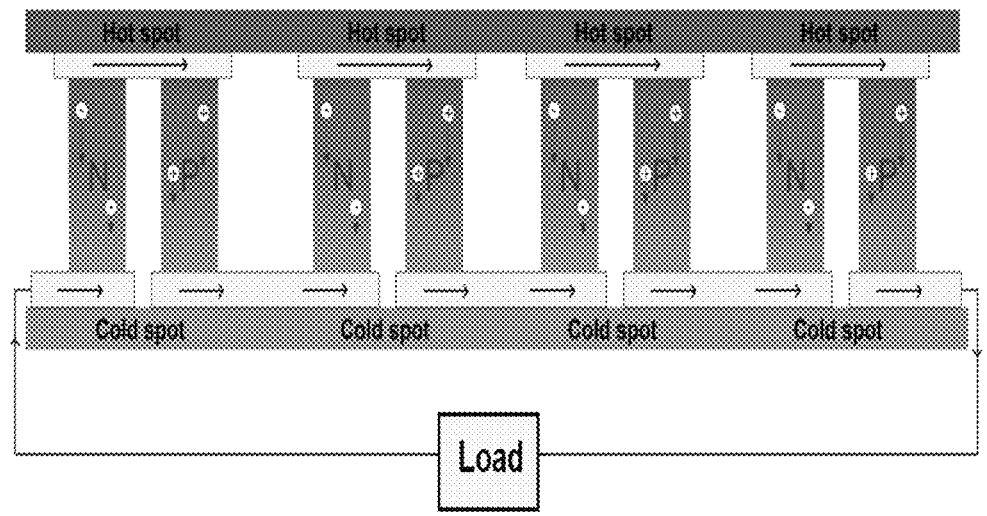
Fig. 14

INFRARED SUBWAVELENGTH FOCUSING IN SILICON AND ENERGY HARVESTING DEVICES

CROSS-REFERENCE TO RELATED APPLICATIONS

This application claims priority from U.S. Provisional Patent Application 62/650,627 filed Mar. 30, 2018, which is incorporated herein by reference. This application claims priority from U.S. Provisional Patent Application 62/816,088 filed Mar. 9, 2019, which is incorporated herein by reference.

STATEMENT REGARDING FEDERALLY SPONSORED RESEARCH OR DEVELOPMENT

None.

FIELD OF THE INVENTION

The present invention relates to planar lens structures designed for operation at infrared wavelengths and use of such structures in solid state devices for energy harvesting.

BACKGROUND OF THE INVENTION

According to the diffraction theory, when light passes through a subwavelength aperture, it diffracts in all directions and has weak transmission. This puts a limitation on the smallest feature size that could be achieved in integrated to photonic circuits or systems. However, in 1998, Thomas Ebbesen found that an opaque screen perforated with a number of subwavelength holes transmitted more light than what was expected from the total area of the holes. This phenomenon was referred to as extraordinary optical transmission (EOT).

Subsequent studies showed that the phenomenon could be attributed to the excitation of surface plasmon polaritons (SPPs). Following the discovery of this phenomenon, many subwavelength optical devices and metasurfaces were made such as the plasmonic lens. Different phase modulation approaches have been used to make subwavelength focusing lenses at visible wavelengths. Those techniques include depth modulation, width modulation, refractive index modulation of the filling material, both width and refractive index modulation, and initial phase modulation.

Research efforts have primarily been limited to studying the plasmonic effect in the visible range and building structures that can manipulate light in this range. Although it would be desirable to produce such devices in the mid-infrared range, it has remained a challenge to transfer the knowledge acquired in visible plasmonics to the mid-infrared domain because the materials used for focusing at visible wavelengths have an unsuitable response at mid-infrared wavelengths (2-20 μm.) Although the mid-infrared range covers a large wavelength domain, there is still a need for a material platform to enable plasmonic focusing devices in the infrared range (700 nm to 1 mm).

BRIEF SUMMARY OF THE INVENTION

The present invention provides planar lens structures for subwavelength focusing of infrared radiation in silicon with high transmission efficiency. The structures are able to focus in the infrared wavelengths using copper and silicon materials, which are specifically suitable for the mid-infrared range. In addition these materials are low cost and CMOS compatible.

The structures focus infrared radiation into a silicon substrate, creating localized hot spots. The resulting heat gradients in the silicon can be converted to electricity. Thus, the invention also provides silicon-based energy harvesting devices using the Seebeck effect. Embodiments can operate at the wavelength of 10 μm which is the peak of the back radiation of the Earth. Such devices can thus be used for charging silicon integrated circuit devices.

In addition to heat harvesting, the structures can be useful in other compact applications that require manipulating the mid-infrared radiation on a very small scale. The structures also can be used for sensing, infrared spectroscopy and other applications.

In one aspect, the invention provides an infrared subwavelength metasurface lens comprising a silicon substrate and a metasurface deposited on a surface of the silicon substrate, wherein the metasurface comprises multiple discrete copper elements separated by uniformly distributed slits of different widths to implement slit width modulation focusing of infrared light into a subwavelength region located within the silicon substrate.

In one implementation, each of the slits is filled with air. Alternatively, in another implementation, each of the slits is filled with either silicon or air, where some of the slits are filled with silicon to implement refractive index modulation focusing.

Preferably, the the widths of the discrete copper elements, the widths of the slits, and the thickness of the metasurface have values less than a predetermined operational mid-infrared wavelength. For example, in some embodiments the metasurface has a thickness in the range 1.0 to 2.5 μm, wherein the multiple discrete copper elements are contained in a 30 μm diameter, where the slits have widths in the range from 0.8 to 1.5 μm, where the widths are organized symmetrically with respect to reflection about a central slit.

In another aspect, the invention also provides a thermoelectric infrared harvesting device comprising: an infrared subwavelength metasurface lens comprising a silicon substrate and a metasurface deposited on a surface of the silicon substrate, wherein the metasurface comprises multiple discrete copper elements separated by uniformly distributed slits of different widths to implement slit width modulation focusing of infrared light into a subwavelength focal region located within the silicon substrate; and a thermoelectric generator having a p-type semiconductor material and an n-type semiconductor material coupled to the silicon substrate at two distinct locations, where one location is the focal region located within the silicon substrate.

BRIEF DESCRIPTION OF THE SEVERAL VIEWS OF THE DRAWINGS

FIG. 13. An illustration of heat harvesting using Seebeck effect.

FIG. 14. An illustration of a thermoelectric generator made of three thermoelectric couples connected electrically in series and thermally in parallel.

DETAILED DESCRIPTION OF THE INVENTION

Figure 1:
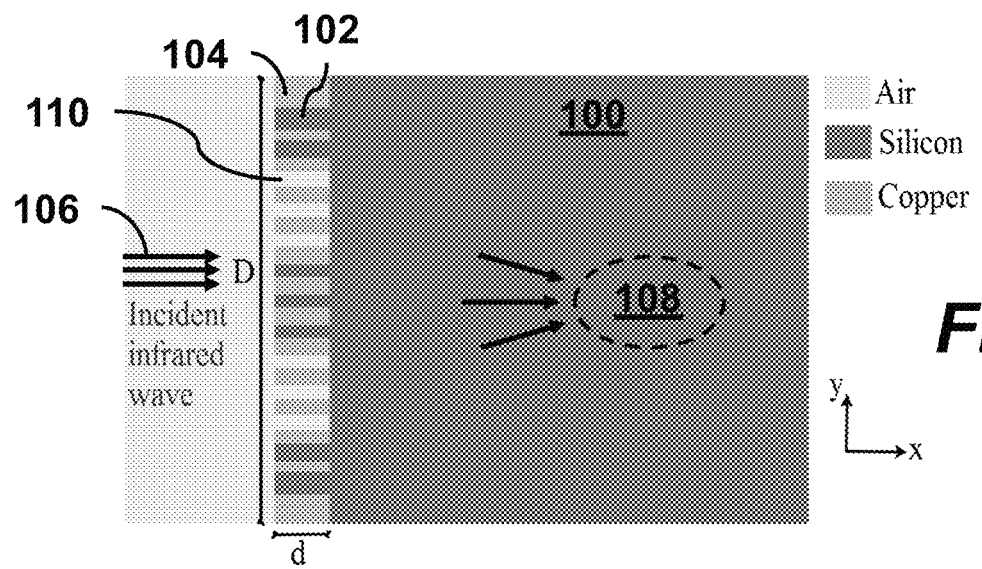
FIG. 1. The first metasurface based on the approach of both slit width modulation and refractive index modulation of the filling materials in the slits.

The ability to focus mid-infrared radiation would be useful for different heat harvesting applications. It can also be useful in medical diagnosis and non-invasive health checks. In addition, most molecules have unique absorption lines or signature in the mid-infrared range which could facilitate the study and analysis of many gases and biological molecules. Sensing, thermal photovoltaic cells, infrared integrated cameras, environmental monitoring and control are also possible applications of the mid-infrared range. The present invention provides structures and devices that can focus the mid-infrared radiation in the subwavelength scale for these purposes.

The mid-infrared wavelength focusing achieved by these structures creates focused light within a silicon substrate and with high transmission making it specifically advantageous and well suited for silicon-based heat harvesting applications. The structures are made of copper and silicon so they can also be integrated in various CMOS applications. Copper specifically has lower absorption losses in the mid-infrared range and is cheaper compared to traditional metals used in visible plasmonics such as gold or silver. Silicon is also thermally stable in this range. Both copper and silicon are thus advantageous design materials for these structures in the mid-infrared range.

In energy harvesting devices according to the invention, a thermal gradient is created by focusing the mid-infrared radiation into a hot spot in a silicon substrate which would be surrounded by a relatively cold region. The heat flow resulting from the thermal gradient between the cold and hot regions creates a voltage difference and thus can be used to deliver electric power to an external load using the Seebeck effect.

The mid-infrared subwavelength focusing in silicon is implemented using phase modulation techniques adapted to the copper-silicon infrared material system from modulation techniques previously used at visible wavelengths in other material systems.

Theoretical Background

The propagation constant $\beta$ of the plasmonic mode in a subwavelength metallic slit of width $\omega$ and depth d is given by the relation $$\tanh\left(\frac{w}{2}\sqrt{\beta^2 - k_0^2 \varepsilon_0}\right) = \frac{-\varepsilon_d \sqrt{\beta^2 - k_0^2 \varepsilon_m}}{-\varepsilon_m \sqrt{\beta^2 - k_0^2 \varepsilon_d}} \quad (1)$$

where $k_o$ is the wave vector of the incident wave in free space, $\varepsilon_m$ and $\varepsilon_d$ are the relative dielectric constants of the metal and the dielectric material filling the slit respectively, and w is the width of the slit.

If we have a number of slits in tandem, we can get a focusing effect by designing the slits such that they give different phase retardations to the incident wave in order to get a curved wavefront in the output.

Phase modulation results from varying either the slit depth d as in or the propagation constant $\beta$. A lens with focusing based on depth modulation faces the same fabrication difficulties of the conventional glass lenses which are non-planar surfaces.

From equation (1), the propagation constant $\beta$ can be modulated by varying the slit width w or the refractive index of the dielectric material filling the slit (i.e., $\varepsilon_d$) or by varying both w and Ed assuming we are using a certain metal with a dielectric constant $\varepsilon_m$.

When we have multiple subwavelength slits placed in tandem, in order for the output waves to reach the focal point in phase, the phase delay should satisfy the following equation of the equal optical length principle:

$$f(x) = 2n\pi + \frac{2\pi f}{\lambda} - \frac{2\pi \sqrt{f^2 + x^2}}{\lambda} \quad (2)$$

where n is an arbitrary integer, $\lambda$ is the wavelength of the incident radiation and f is the focal length, x is the position of any slit measured from the central slit along the vertical axis, f(x) is the phase space distribution in the output.

As will be described in more detail below, in one embodiment of a focusing metasurface structures in the infrared, both slit width modulation and refractive index modulation of the filling material in the slits is used. In a second embodiment, slit width modulation alone is used.

In the embodiment using slit width modulation only, the slits increase in width from the central slit to the side slits so each slit experiences a different phase shift such that a curved wavefront is produced in the output. The wave is slower inside the narrower slits at the middle of the structure since most of the plasmonic mode resides in the metal. Therefore, the middle slits introduce higher phase delay than the side slits which are wider in width.

In the embodiment that modulates by varying both the slit width and refractive index of the filling material in the slits, an extended phase delay range leads to improving the focusing performance where the light intensity is greatly enhanced at the focus.

Width-modulated planar lenses designed for operation in the visible wavelength range face a fabrication difficulty because the slits that are narrower than 30 nm are very difficult to fabricate in a thick metal film. However, this problem is not encountered in mid-infrared designs because the dimensions in the mid-infrared range are greater and thus will not face the same fabrication difficulty faced by the width-modulated planar lenses in the visible range.

Embodiments of the subwavelength focusing metasurface structures use copper as a metal. Copper is advantageous because it has lower absorption losses in the mid-infrared range compared to the traditional metals used in visible plasmonics such as silver or gold. At the mid-infrared wavelength of 10 µm, the extinction coefficient of copper is 49, while gold is slightly higher at 53.4 and silver is 71.9. Copper is also cheaper compared to gold or silver or other metamaterials used in focusing.

In addition, copper has CMOS compatibility, so the structures of the present invention can be integrated in CMOS applications.

FIG. 1 is a schematic diagram of a first embodiment of a mid-infrared subwavelength focusing metasurface structure, where a combination of both slit width modulation and refractive index modulation of filling materials in the slits are used to focus incident mid-infrared light 106 to a focal region 108 within the silicon substrate 100. The metasurface is disposed on a surface of the substrate 100 and is composed of a sequence of discrete copper elements 104 forming slits between them, where each slit is filled with either silicon 102 or air 110 filling material. The mid-infrared radiation 106 is incident from the left through air, interacts with the metasurface, and is focused within silicon substrate 100 in a focal region 108.

The copper elements 104 are equally spaced but have various different widths, resulting in different slit widths. The pattern of slit widths and filling materials is symmetrical about a central slit of the metasurface which is positioned along the optical axis left of the focal region 108. The slit widths increase from the center towards the sides, and the slits are equally spaced from each other.

In one illustrative implementation of this embodiment, the metasurface lens has depth d=1 µm and lens aperture diameter D=30 µm. There are N=13 slits (6 slits on each side of the central slit). The slits range in width from 0.8 µm at the center of the structure to 1.5 µm on the side and are spaced 2 µm apart. The thickness of the silicon substrate on which the metasurface structure is formed is 170 µm. The detailed values of the slit positions, widths and filling materials are shown in Table 1.

TABLE 1

The slit positions, widths and filling materials in the lens of FIG. 1

| Slit number | Slit position in microns (along the vertical axis) | Slit width in microns | Filling material in the slit |
|---|---|---|---|
| 0 (central slit) | 0 | 0.8 | silicon |
| 1 | 2 | 0.8 | silicon |
| 2 | 4 | 0.8 | air |
| 3 | 6 | 0.9 | air |
| 4 | 8 | 1 | air |
| 5 | 10 | 1.2 | silicon |
| 6 | 12 | 1.5 | silicon |

The table gives only the details of the upper half of the metasurface since the structure is symmetrical.

Figure 2:
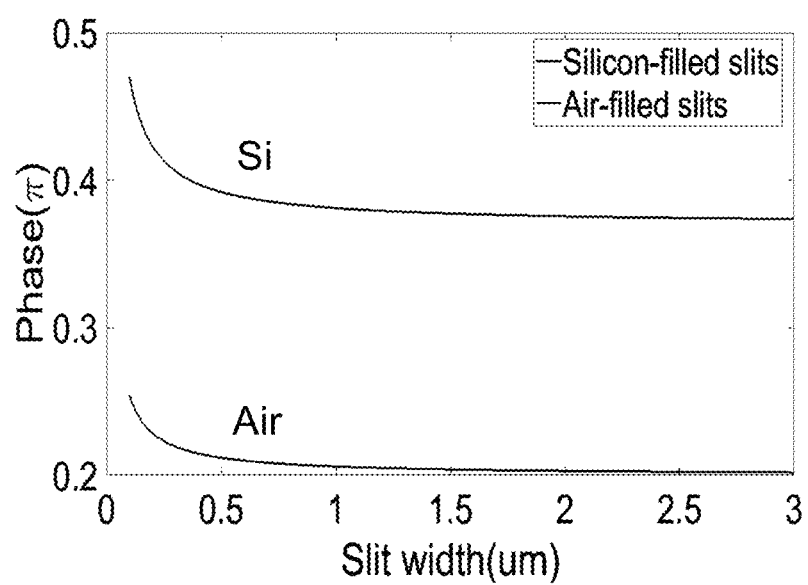
FIG. 2. The variation of the phase delay with the slit width for the first metasurface in FIG. 1 in case of silicon filling and air filling.

The wavelength of the plane wave incident from the left side of the lens is λ=10 µm (i.e., the peak wavelength of the back radiation of the Earth). At this wavelength, the relative permittivity of copper is $\varepsilon_m$=−2342.48+i 1059.9 and the refractive index of silicon is 3.42. The two curves shown in FIG. 2 show the phase delay versus the slit width for air-filled slits ($\varepsilon_d$=1, bottom curve) and silicon-filled slits ($\varepsilon_d$=3.42, top curve).

Figure 3:
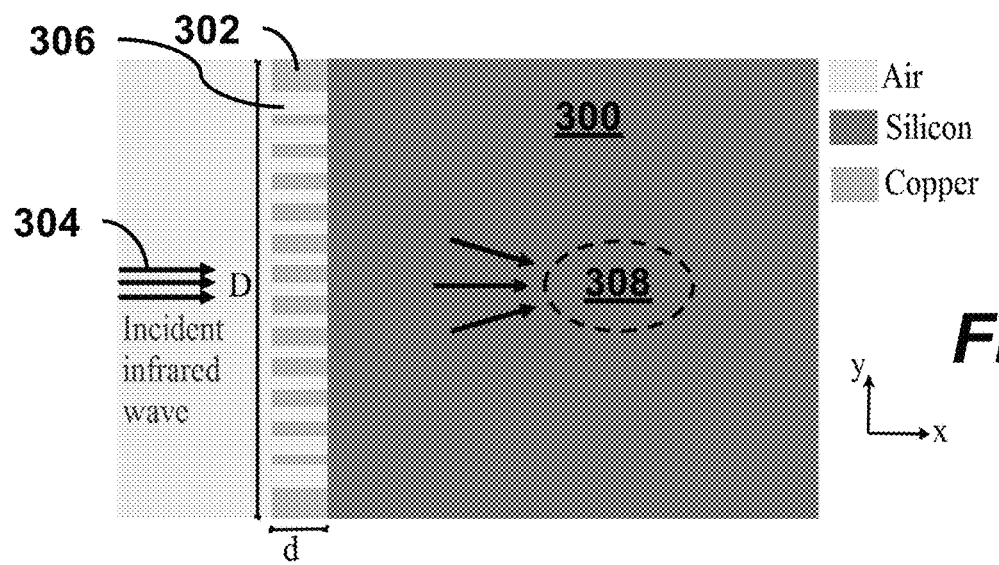
FIG. 3. The second metasurface based on width modulation only.

FIG. 3 is a schematic diagram of a second embodiment of a mid-infrared subwavelength focusing metasurface structure, where slit width modulation alone is used to focus incident mid-infrared light 304 to a focal region 308 within the silicon substrate 300. The metasurface is disposed on a surface of the substrate 300 and is composed of a sequence of discrete copper elements 302 forming slits between them, where each slit is filled with air 306 filling material. The mid-infrared radiation 304 is incident from the left through air, interacts with the metasurface, and is focused within silicon substrate 300 in a focal region 308.

The copper elements 302 are equally spaced but have various different widths, resulting in different slit widths. The pattern of slit widths is symmetrical about a central slit of the metasurface which is positioned along the optical axis left of the focal region 308. The slit widths increase from the center towards the sides, and the slits are equally spaced from each other.

In one illustrative implementation of this embodiment, the metasurface lens has depth d=2.5 µm and lens aperture diameter D=30 µm. The wavelength of the plane wave incident from the left side of the lens is λ=10 µm (i.e., the peak wavelength of the back radiation of the Earth). There are N=13 slits (6 slits on each side of the central slit). The slits range in width from 0.8 µm at the center of the structure to 1.5 µm on the side and are spaced 2 µm apart. The thickness of the silicon substrate on which the metasurface structure is formed is 280 µm. The detailed values of the slit positions, widths and filling materials are shown in Table 2.

TABLE 2

The slit positions, widths and filling materials in the second lens

| Slit number | Slit position in microns (along the vertical axis) | Slit width in microns | Filling material in the slit |
|---|---|---|---|
| 0 (central slit) | 0 | 0.8 | air |
| 1 | 2 | 0.8 | air |
| 2 | 4 | 0.8 | air |
| 3 | 6 | 0.9 | air |
| 4 | 8 | 1 | air |
| 5 | 10 | 1.2 | air |
| 6 | 12 | 1.5 | air |

Figure 4:
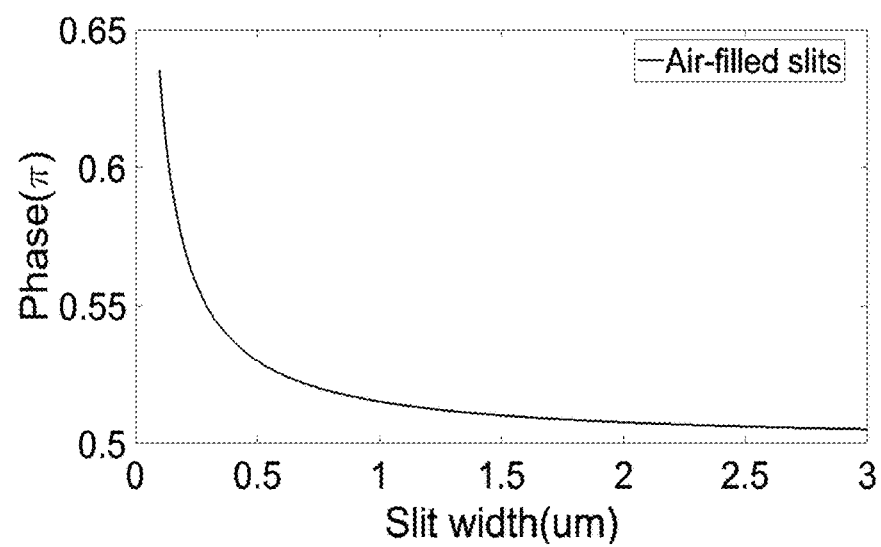
FIG. 4. The variation of the phase delay with the slit width for the second metasurface in FIG. 3 whose slits are only filled with air.

The curve shown in FIG. 4 shows the phase delay versus the slit width for air-filled slits ($\varepsilon d$=1).

A commercial-grade simulator based on the finite-difference time-domain method was used to obtain the following simulation results for the two example implementations described above.

Figure 5:
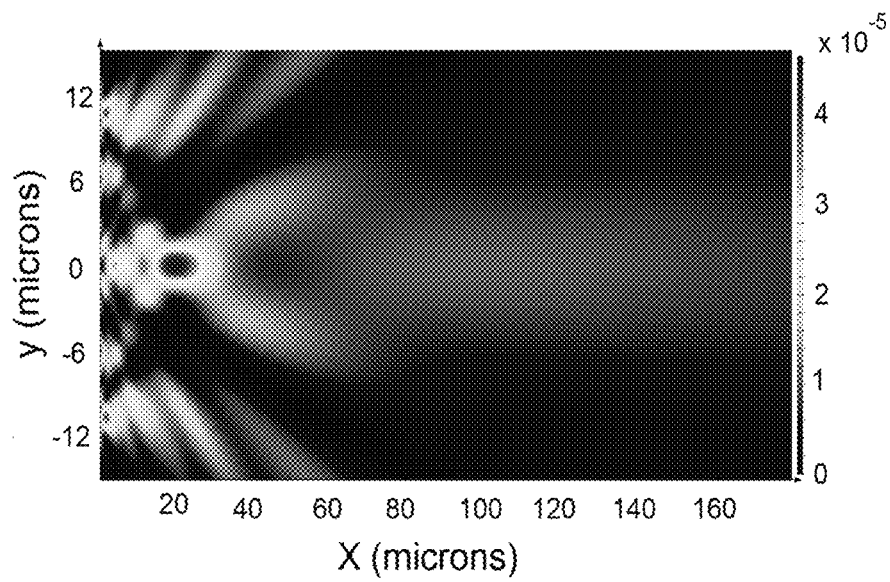
FIG. 5. The magnetic field intensity distribution $|H1|^2$ of the focused radiation in case of the first metasurface in FIG. 1 based on both width and refractive index modulation of the filling materials. The field intensity is measured in arbitrary units.
Figure 6:
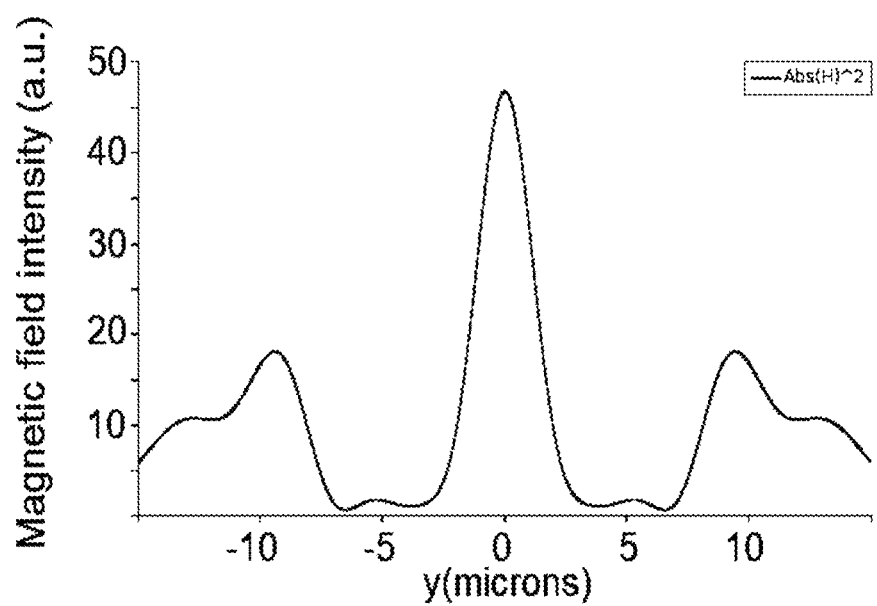
FIG. 6. A vertical cross-section passing through the center of the focus for the magnetic field intensity in case of the first metasurface in FIG. 1 (based on both width and refractive index modulation of the filling materials). The field intensity is measured in arbitrary units.

FIG. 5 shows the magnetic field intensity distribution $|H1|^2$ of the focused mid-infrared radiation for the metasurface of FIG. 1, and FIG. 6 is a graph of the vertical cross-section of magnetic field intensity passing through the center of the focus. The field intensity is measured in arbitrary units. The focal length was found to be 19.5 μm and the full width half maximum (FWHM) is 2.64 μm which is almost quarter the wavelength of the incident mid-incident infrared wave (λ=10 μm) and thus we have super focusing. The attained transmission efficiency is 46% (the input is TM-mode).

Figure 7:
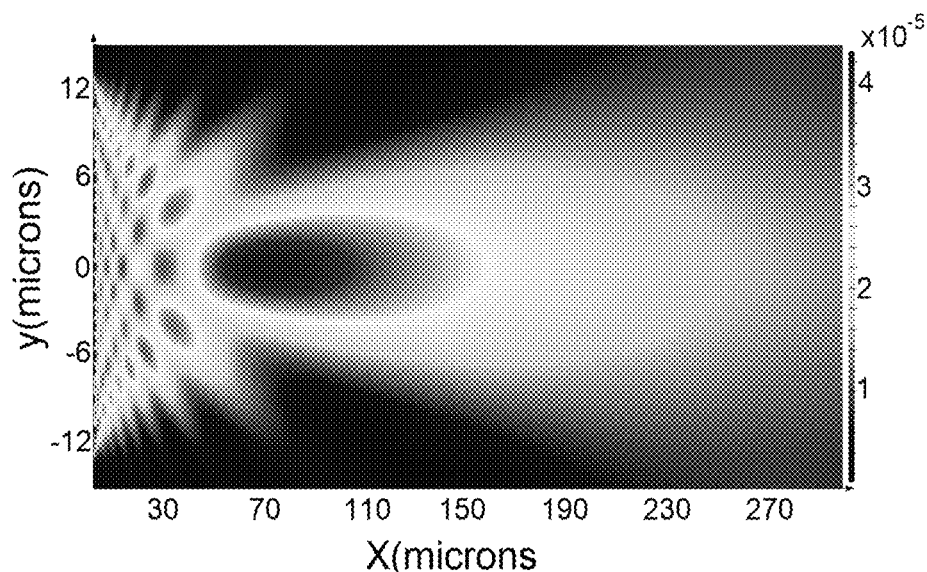
FIG. 7. The magnetic field intensity distribution $|H1|^2$ of the focused radiation in case of the second metasurface in FIG. 3 based on width modulation only. The field intensity is measured in arbitrary units.
Figure 8:
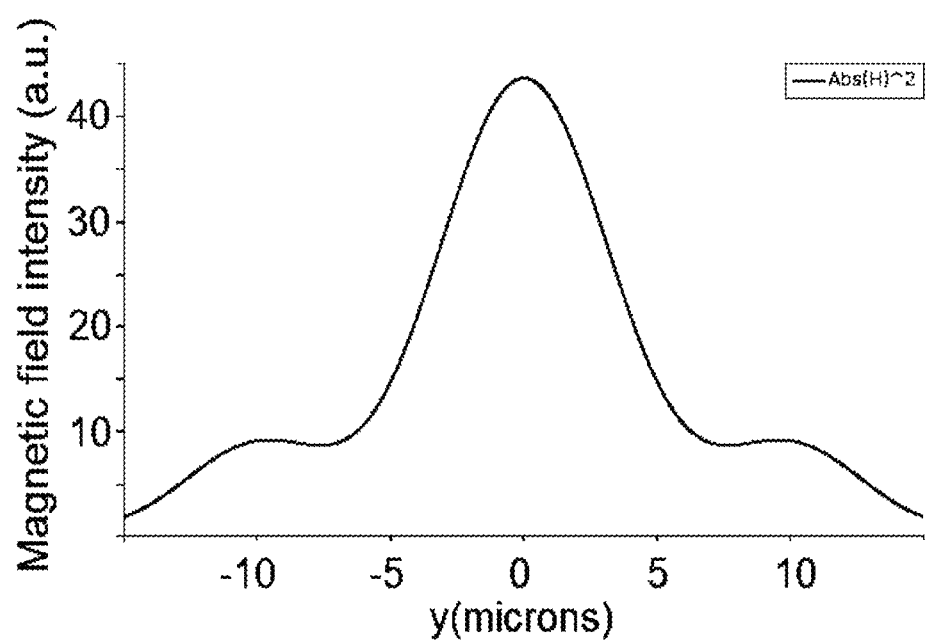
FIG. 8. A vertical cross-section passing through the center of the focus for the magnetic field intensity in case of the second metasurface in FIG. 3 (based on width modulation only). The field intensity is measured in arbitrary units.

FIG. 7 shows the magnetic field intensity distribution |H1|² of the focused mid-infrared radiation for the metasurface in FIG. 3, and FIG. 8 is a graph of the vertical cross-section passing through the center of the focus. The field intensity is measured in arbitrary units. The focal length was found to be 68.5 μm and the FWHM is 7.76 μm which is still smaller than the wavelength of the incident mid-infrared wave. The attained transmission efficiency is 74.33% (the input is TM-mode).

Figure 9:
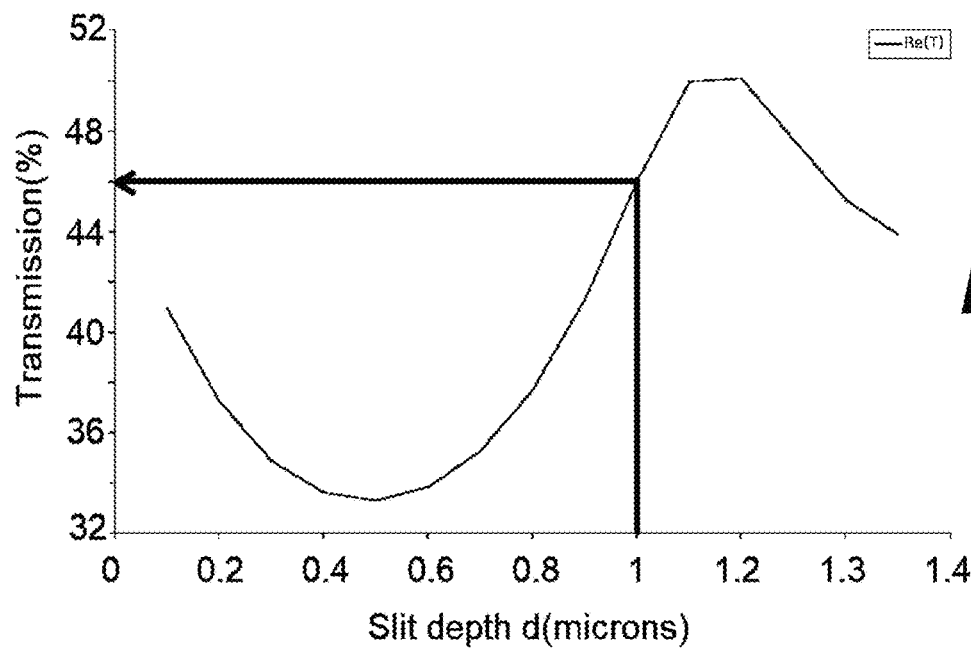
FIG. 9. The transmission percentage versus the slit depth in microns for the first metasurface in FIG. 1.
Figure 10:
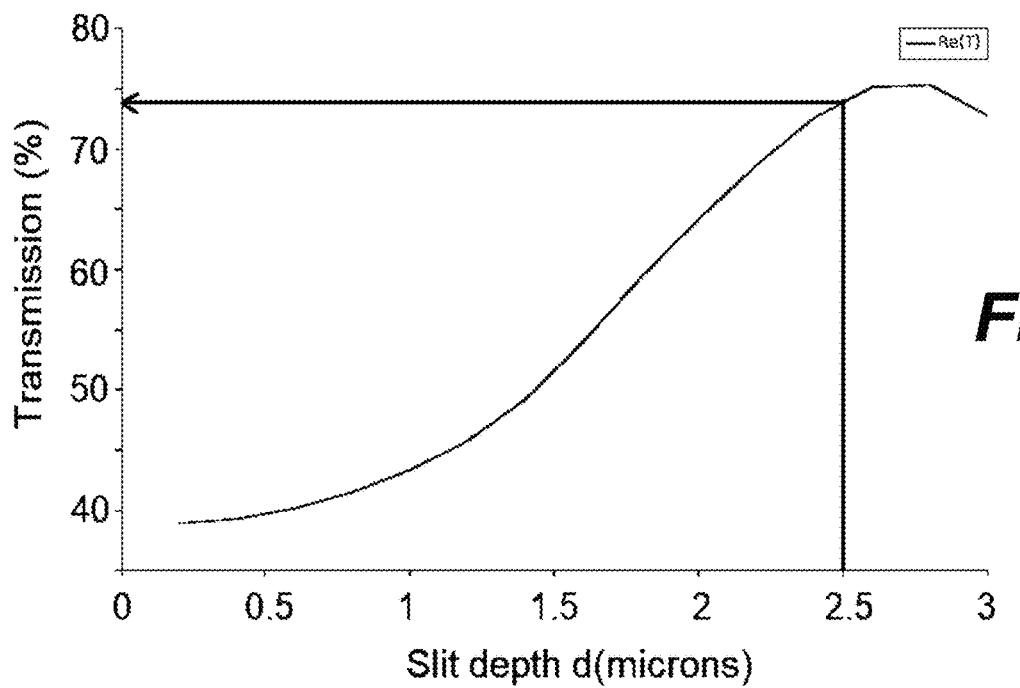
FIG. 10. The transmission percentage versus the slit depth in microns for the second metasurface in FIG. 3.

For both metasurfaces, the transmission varies with the slit depth. We showed this fact by plotting the transmission percentage versus the slit depth for both metasurfaces. FIG. 9 is a graph of the transmission percentage versus the slit depth in microns for the first metasurface in FIG. 1, while FIG. 10 is a graph of the transmission percentage versus the slit depth in microns for the second metasurface in FIG. 3. It should be noted that the focusing performance is not the same for all the transmission values. We noticed that it usually degrades at very high or low transmission so it is up to the designer to choose whether they prefer to have very high transmission at the expense of the focusing performance or the other way around. We designed our metasurfaces at the two points indicated on the graphs because they are the optimum points with regard to both the focusing performance and the transmission efficiency.

The first metasurface of FIG. 1 can be fabricated using a etching and lift-off process, while the second metasurface of FIG. 3 can be fabricated using a lift-off process. The fabrication steps of the metasurface in FIG. 3 are shown in FIG. 11 while the fabrication steps of the metasurface in FIG. 1 are shown in FIGS. 12A-B.

Figure 11:
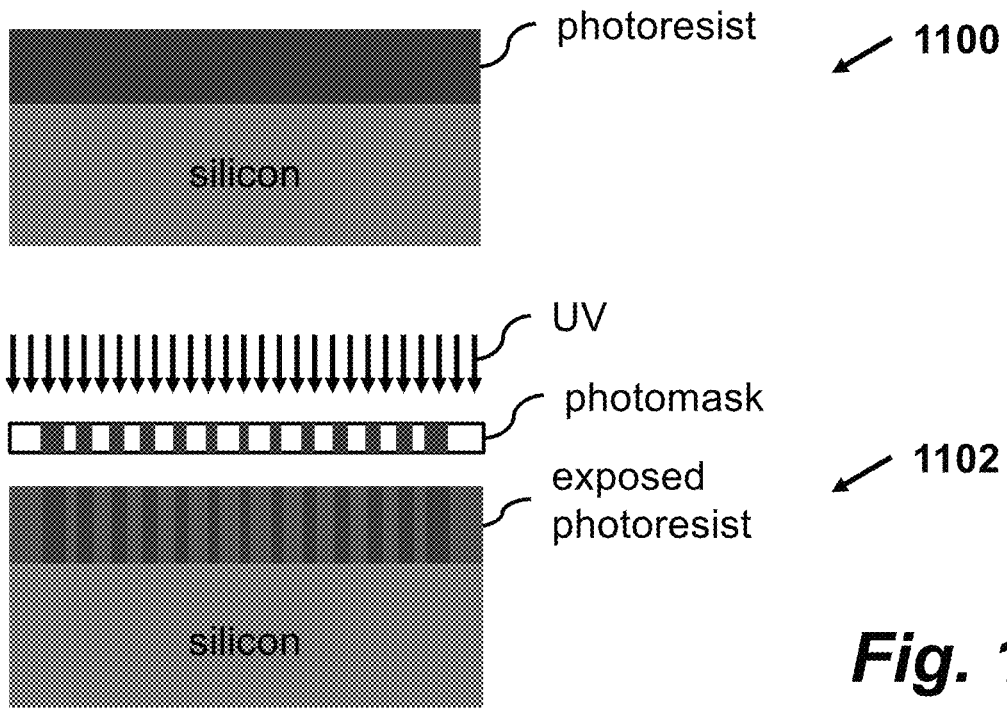
FIG. 11. The lift-off process used to fabricate the metasurface in FIG. 3
Figure 11:
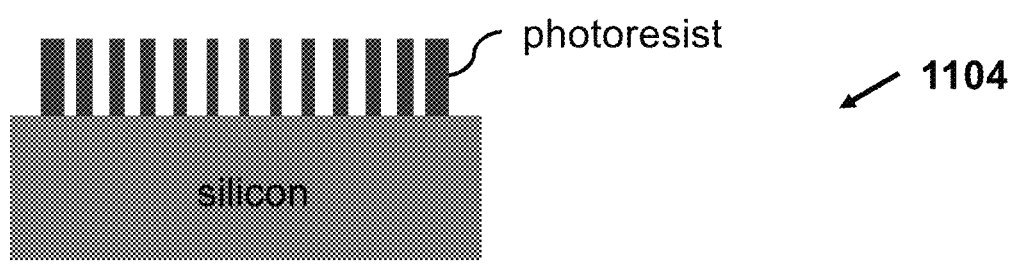
Figure 11:
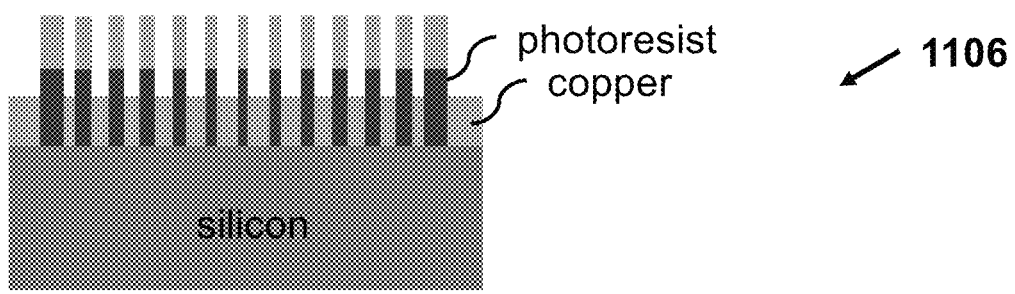
Figure 11:
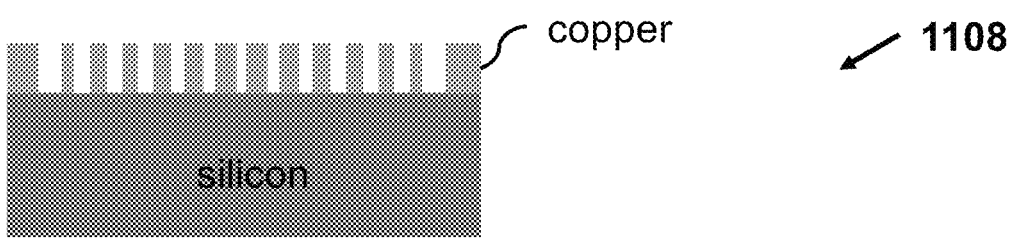

In FIG. 11, the first step 1100 is to deposit a layer of lift-off photoresist on the silicon substrate. The photoresist layer is then exposed to UV light through a photomask in step 1102 to create an inverse pattern for the copper elements. In step 1104 the UV-exposed photoresist removed. Copper is then deposited in step 1106 to fill the gaps in the photoresist. In step 1108 the photoresist and the copper on its surface is lifted off, leaving the desired copper metasurface elements on the silicon, with slits filled with air.

Figure 12A:
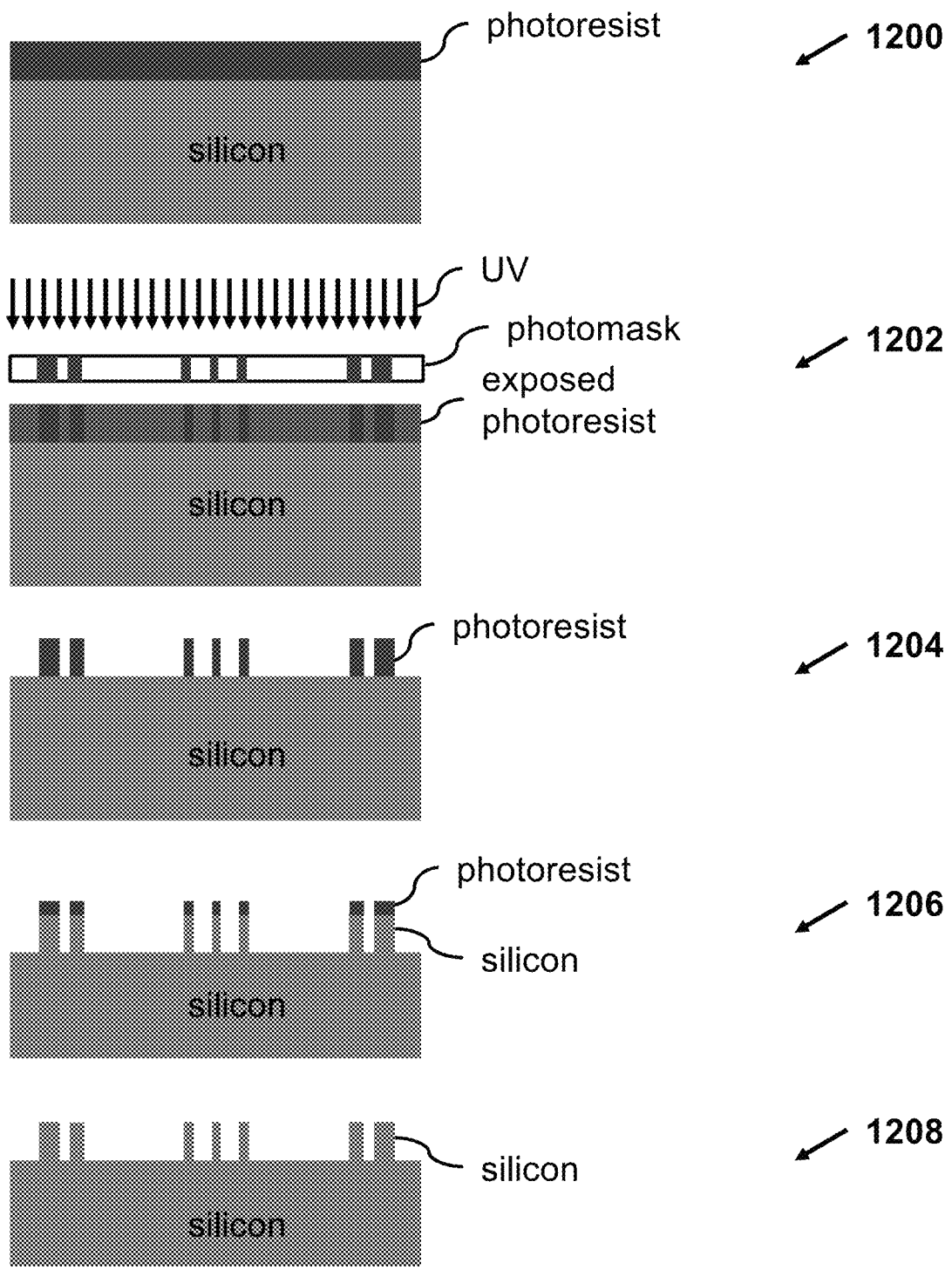
FIGS. 12A-12B. The etching and lift-off processes used to fabricate the metasurface in FIG. 1
Figure 12B:
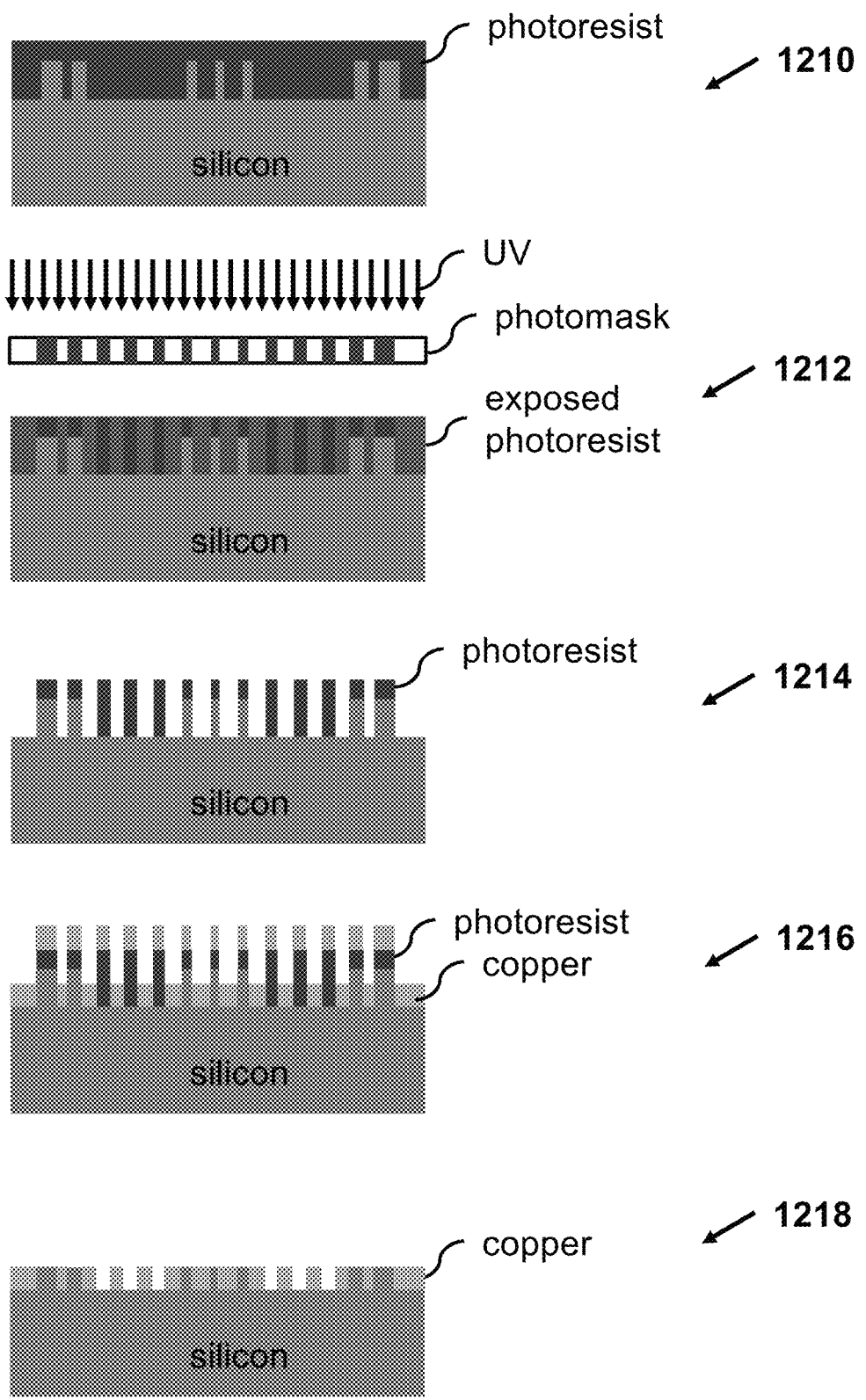

In FIGS. 12A-B, the first step 1200 is to deposit a layer of photoresist on the silicon substrate. The photoresist layer is then exposed to UV light through a photomask in step 1202 to create an inverse pattern for the silicon filler material. In step 12004 the UV-exposed photoresist is removed. The exposed silicon substrate is then etched in step 1206, and the remaining photoresist is removed in step 1208. A layer of lift-off photoresist is deposited in step 1210.

The photoresist layer is then exposed to UV light through a photomask in step 1212 to create an inverse pattern for the copper elements. In step 1214 the UV-exposed photoresist removed. Copper is then deposited in step 1216 to fill the gaps in the photoresist. In step 1218 the photoresist and the copper on its surface is lifted off, leaving the desired copper metasurface elements on the silicon, with slits filled variously with air and silicon.

In step 1216, the photoresist should be sufficiently high to prevent the overlapping of the copper in the gaps and the copper on the top surface of the photoresist, because such an overlapping would prevent the completion of the lift-off process in step 1218.

Embodiments of the present invention also include infrared energy harvesting thermoelectric generator devices for generating electricity from the focused infrared radiation in the silicon substrate. Thermoelectric generators are solid-state devices that can convert heat energy into electricity when there is a thermal gradient between two dissimilar conductors. This effect is called the Seebeck effect. As illustrated in FIG. 13, a thermoelectric module is composed of two dissimilar thermoelectric materials, which are a p-type (having free holes) semiconductor 1300 and an n-type (having free electrons) semiconductor 1302 connected at their ends to a conductor 1304 thermally coupled to a hot spot 1306 (e.g., the focal region of a silicon substrate). At their other ends, the thermoelectric materials 1300 and 1302 are connected to contacts 1310 and 1312, respectively, that are thermally coupled to a cold spot 1308 (e.g., a region of the silicon substrate far from the focal region). The heat flow resulting from the thermal gradient in the thermoelectric material leads to the diffusion of the mobile charge carriers between the hot and cold surfaces creating a voltage difference. Therefore, the thermoelectric generator can be used to deliver electric power to an external load 1314 connected to it. The current flow that occurs is due to the fact that the free carriers in the semiconductor carry charge as well as heat while they diffuse from the hot to the cold end.

The voltage difference obtained across the load is given by $$\Delta V = -S\Delta T \quad (3)$$

where S is the Seebeck coefficient and ΔT is the temperature difference across the thermoelectric material. The current generated as a result of the temperature difference across the thermoelectric generator is given by $$I = \frac{S\Delta T}{R_{TE} + R_e} \quad (4)$$

where $R_{TE}$ and $R_e$ are the electrical resistance of the thermoelectric generator and the external load resistance respectively.

The power delivered to the external load is given by $$P = I^2 R_e = \frac{S^2 \Delta T^2 R_e}{(R_{TE} + R_e)^2} \quad (5)$$

Differentiating the power with respect to the load resistance leads to the condition of maximum power transfer known as impedance matching $$R_e = R_{TE} \quad (6)$$

This implies that maximum power is delivered to the external load resistance and in this case the maximum thermoelectric generator when its internal resistance is equal to the power is given by $$P_{max} = \frac{S^2 \Delta T^2}{4 R_{TE}} \quad (7)$$

Therefore, in order to obtain maximum power at the load, the internal resistance of the thermoelectric generator should match the load resistance. We also notice that the maximum power itself is directly proportional to the square of both the Seebeck coefficient and the temperature difference and is inversely proportional to the internal resistance of the thermoelectric generator which means we can increase the maximum power driven from the thermoelectric generator by minimizing its internal resistance, maximizing the temperature gradient and choosing a thermoelectric material with the highest possible Seebeck coefficient.

Referring back to the embodiments of FIG. 1 and FIG. 3, the focal region 108, 308 in the silicon substrate 100, 300 where the mid-infrared radiation is focused serves as the hot spot 1306 while any other region of the silicon substrate 100, 300 where there is no focusing serves as the cold spot 1308.

Multiple metasurfaces can be placed in tandem to make a device containing several thermoelectric couples which may be connected electrically in series and thermally in parallel to obtain a larger voltage difference at the load. FIG. 14 shows an example of a thermoelectric generator made of four thermoelectric couples connected electrically in series and thermally in parallel. Their four hot spots are four focusing regions of four corresponding metasurface structures of FIG. 1 or FIG. 3.

The thermoelectric couples will be connected to the hot/cold regions via an electrical conductor (e.g. copper) as in 1304, 1310 and 1312. The electrical conductor could be fabricated to adhere to the silicon substrate via an adhesive material like Titanium or Chromium.

There is a general trade-off between the focusing resolution and the transmission efficiency. For certain applications like heat harvesting, it would be desirable to have high transmission efficiency while for other applications like lithography the focusing resolution would be critical. Therefore, the metasurfaces described herein can serve in different applications according to the critical requirement of the application itself. The proposed metasurfaces are well suited for integration in heat harvesting, sensing, medical diagnosis and different silicon based applications. It has also been described how the transmission efficiency varies with the slit depth in both metasurfaces. Thus, based on the teachings contained to herein, those skilled in the art will be able to implement a variety of such devices having parameters suitable for a range of different applications.

The invention claimed is:

1. An infrared subwavelength metasurface lens comprising a silicon substrate and a metasurface deposited on a surface of the silicon substrate, wherein the metasurface comprises multiple discrete copper elements separated by uniformly distributed slits of different widths to implement slit width modulation focusing of infrared light into a subwavelength region located within the silicon substrate, wherein each of the uniformly distributed slits is filled with either silicon or air, and wherein some of the uniformly distributed slits are filled with silicon to implement refractive index modulation focusing.

2. The infrared subwavelength metasurface lens of claim 1 wherein each of the uniformly distributed slits is filled with air.

3. The infrared subwavelength metasurface lens of claim 1 wherein the widths of the discrete copper elements, the widths of the uniformly distributed slits, and the thickness of the metasurface have values less than a predetermined operational mid-infrared wavelength.

4. The infrared subwavelength metasurface lens of claim 1 wherein the metasurface has a thickness in the range 1.0 to 2.5 µm, wherein the multiple discrete copper elements are contained in a 30 µm diameter, where the uniformly distributed slits have widths in the range from 0.8 to 1.5 µm, where the widths are organized symmetrically with respect to reflection about a central slit.

5. A thermoelectric infrared harvesting device comprising:
  a) an infrared subwavelength metasurface lens comprising a silicon substrate and a metasurface deposited on a surface of the silicon substrate, wherein the metasurface comprises multiple discrete copper elements separated by uniformly distributed slits of different widths to implement slit width modulation focusing of infrared light into a subwavelength focal region located within the silicon substrate, wherein each of the uniformly distributed slits is filled with either silicon or air, and wherein some of the uniformly distributed slits are filled with silicon to implement refractive index modulation focusing;
  b) a thermoelectric generator having a p-type semiconductor material and an n-type semiconductor material coupled to the silicon substrate at two distinct locations, where one location is the focal region located within the silicon substrate.

* * * * *